United States Patent
Balogh

(10) Patent No.: US 11,654,957 B2
(45) Date of Patent: May 23, 2023

(54) MULTICHANNEL ELECTRONIC CONTROL UNIT ARCHITECTURE FOR ELECTROMECHANICAL POWER STEERING SYSTEMS

(71) Applicants: thyssenkrupp Presta AG, Eschen (LI); thyssenkrupp AG, Essen (DE)

(72) Inventor: András Balogh, Tordas (HU)

(73) Assignees: THYSSENKRUPP PRESTA AG, Eschen (LI); THYSSENKRUPP AG, Essen (DE)

( * ) Notice: Subject to any disclaimer, the term of this patent is extended or adjusted under 35 U.S.C. 154(b) by 510 days.

(21) Appl. No.: 16/639,606

(22) PCT Filed: Aug. 30, 2017

(86) PCT No.: PCT/EP2017/071728
§ 371 (c)(1),
(2) Date: Feb. 17, 2020

(87) PCT Pub. No.: WO2019/042536
PCT Pub. Date: Mar. 7, 2019

(65) Prior Publication Data
US 2020/0290667 A1    Sep. 17, 2020

(51) Int. Cl.
*B62D 5/04* (2006.01)
*B62D 1/04* (2006.01)
(Continued)

(52) U.S. Cl.
CPC .............. *B62D 5/0463* (2013.01); *B62D 1/04* (2013.01); *B62D 5/005* (2013.01); *B62D 5/0484* (2013.01);
(Continued)

(58) Field of Classification Search
CPC ...... B62D 1/04; B62D 5/0463; B62D 5/0484; B62D 5/0493; B62D 5/049; B62D 5/0406
See application file for complete search history.

(56) References Cited

U.S. PATENT DOCUMENTS 6,650,979 B1    11/2003 Kreft
2003/0114960 A1    6/2003 Takenaka et al.
(Continued)

FOREIGN PATENT DOCUMENTS

CN    1486900 A    4/2004
CN    102929147    * 2/2013
(Continued)

OTHER PUBLICATIONS

CN102929147 translation from Espacenet; downloaded on Apr. 7, 2022 (Year: 2022).*
(Continued)

*Primary Examiner* — Jacob D Knutson
*Assistant Examiner* — Abigail R Hymel
(74) *Attorney, Agent, or Firm* — thyssenkrupp Norm America, LLC

(57) ABSTRACT

A motor electric control unit (ECU) for an electromechanical power steering mechanism, which controls current through an electric assist motor in response to steering mechanism sensors' signals. The ECU may comprise at least two channels. Each channel has the steering mechanism sensors in a redundancy concept. At least one voter that is assigned to an actuator and is configured to vote on the correct steering mechanism sensors' outputs of the at least two channels. The steering mechanism sensors may include a steering column torque sensor and an RPS sensor for sensing a rotor angle of the electric assist motor. Each of the at least two channels may include processors that have different software to protect against systematic faults.

10 Claims, 1 Drawing Sheet

(51) Int. Cl.
  *B62D 5/00*   (2006.01)
  *B62D 15/02*  (2006.01)
  *G01D 5/14*   (2006.01)
  *G01L 5/22*   (2006.01)
  *G01R 19/00*  (2006.01)

(52) U.S. Cl.
  CPC ....... *B62D 5/0493* (2013.01); *B62D 15/0235* (2013.01); *G01D 5/14* (2013.01); *G01L 5/221* (2013.01); *G01R 19/0092* (2013.01)

(56) References Cited

U.S. PATENT DOCUMENTS

| | | | |
|---|---|---|---|
| 2003/0114969 A1 | 6/2003 | Dominke | |
| 2004/0040778 A1* | 3/2004 | Katou | B62D 5/003 |
| | | | 180/402 |
| 2014/0358375 A1 | 12/2014 | Sakai et al. | |
| 2015/0033357 A1* | 1/2015 | Habel | G06F 21/60 |
| | | | 726/26 |
| 2016/0229445 A1 | 8/2016 | Sasaki | |
| 2016/0231142 A1 | 8/2016 | Kawano et al. | |
| 2016/0339945 A1 | 11/2016 | Kozawa et al. | |
| 2016/0347353 A1* | 12/2016 | Wada | B60K 6/26 |

FOREIGN PATENT DOCUMENTS

| | | |
|---|---|---|
| CN | 102929157 A | 2/2013 |
| CN | 104210543 A | 12/2014 |
| CN | 105045164 A | 11/2015 |
| CN | 106063096 A | 10/2016 |
| CN | 106168521 A | 11/2016 |
| DE | 102016208432 A | 11/2016 |
| EP | 2810853 A | 12/2014 |

OTHER PUBLICATIONS

The International Search Report issued in PCT/EP2017/071728, dated Apr. 19, 2018.

* cited by examiner

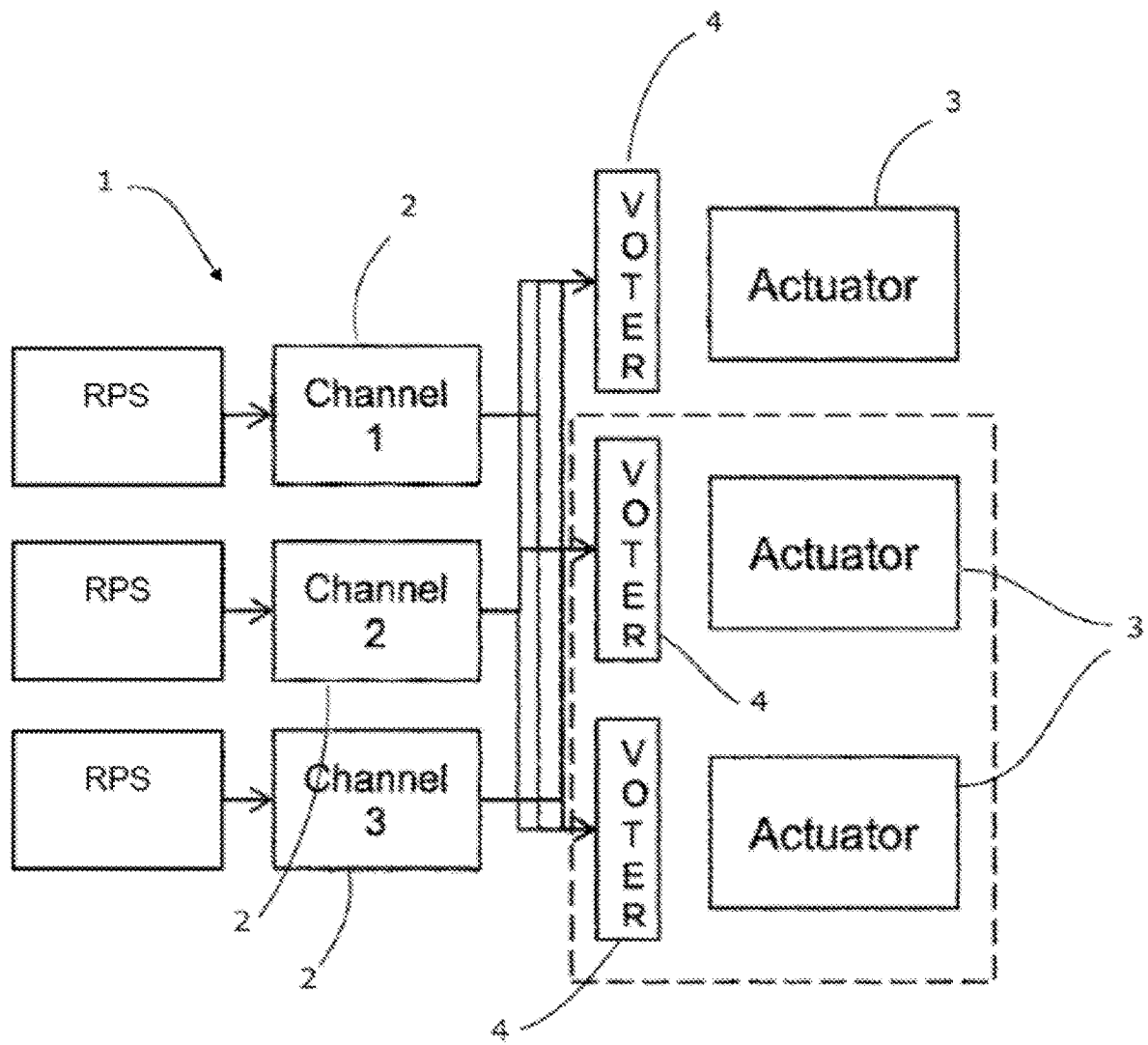

MULTICHANNEL ELECTRONIC CONTROL UNIT ARCHITECTURE FOR ELECTROMECHANICAL POWER STEERING SYSTEMS

The present invention relates to a motor electric control unit of an electromechanical power steering mechanism according to the preamble of claim 1, to an electromechanical power steering mechanism according to the preamble of claim 10 and to a steer-by-wire steering mechanism according to the preamble of claim 11.

In an electromechanical power steering mechanism a steering shaft is connected to a steering wheel for operation by the driver. The steering shaft is coupled to a steering rack via a gear pinion. Steering rack rods are connected to the steering rack and to steered wheels of the motor vehicle. A rotation of the steering shaft causes an axial displacement of the steering rack by means of the gear pinion which is connected to the steering shaft in a torque-proof manner. Assist force is applied to a steering mechanism by driving an electric motor. A steering controller in form of an electronic control unit (ECU) controls the assist of the electric motor. In response to the vehicle velocity, the operator torque and the rotor position signal detected by a rotor position sensor, the controller determines the target motor torque and provides the signal through to the motor controller, where the motor currents are calculated via PWM (pulse-width modulation).

Currently, these ECUs are implemented either as a single channel self-monitoring system or a dual channel self-monitoring system. Current architecture offers limited scalability in regards of safety and availability requirements. The current architectures rely on expensive, special components (MCUs, SBCs) that implement self-monitoring functions and are qualified up to the highest safety integrity level (ASIL-D).

A drawback of this type of motor control is that there is limited selection on ASIL-D qualified components. Further, there is limited scalability on the E/E (electric/electronic) architecture side regarding required availability. Furthermore, commodity components like generic MCUs cannot be used.

It is an object of the present invention to provide a motor electric control unit for a steering mechanism of a vehicle which has an easy architecture and a high safety level at low cost.

This object is achieved by a motor electric control unit for an electromechanical power steering mechanism having the features of claim 1, an electromechanical motor vehicle power steering mechanism for assisting steering of a motor vehicle having the features of claim 10 and a steer-by-wire steering system having the features of claim 11.

A motor electric control unit for an electromechanical power steering mechanism or a steer-by-wire steering mechanism, which controls current through an electric assist motor in response to steering mechanism sensors' signals, is provided, wherein the ECU comprises at least two channels, wherein each channel includes the steering mechanism sensors forming a redundancy concept and wherein at least one voter assigned to an actuator is designed to vote on the correct steering mechanism sensors' outputs of the at least two channels.

This allows the ECU architecture to be built up from fail-arbitrary elements instead of having fail-silent self-monitoring channels. A cost optimal E/E architecture can thus be achieved. Preferably, three channels are used.

It is preferred that the at least two channels each receive the output of a current sensor of the actuator.

In an advantageous embodiment the steering mechanism sensors include a steering column torque sensor and a rotor position sensor (RPS) for sensing the rotor angle of the electric assist motor. The sensors are provided for each channel for redundancy.

Preferably, each of the at least two channels include processors, wherein the processors have different software for each channel to protect against systematic faults.

It is further preferred that the voter is designed to vote on the actuators' inputs of the channels.

The voter is particularly a majority voter with a settable tolerance time, which gives feedback of the health status of each channel to all channels.

Preferably, the voter masks a faulty channel, which is in return neglected for further calculation and the voter synchronizes the state of the software by feeding the same value to all channels.

The redundancy concept allows each channel in itself to qualify only for ASIL-B.

In one embodiment three voters are provided each assigned to a separate actuator. Thus in total three actuators are controlled by the ECU. The voters are designed to drive each actuator with the same majority voted signal.

Further an electromechanical power steering mechanism for assisting steering for a motor vehicle is provided, comprising an electric motor for steering assist and a torque sensor, the electric motor being adapted to apply an assistance torque in response to an output signal from the torque sensor indicative of the input torque applied by a driver of the vehicle to a steering wheel, with a motor electric control unit according to the above description.

Furthermore a steer-by-wire steering system for a motor vehicle is provided, having a steering wheel, a feedback actuator connected to the steering wheel for providing road feedback to a driver, a plurality of road wheels, and a steering actuator with an electric motor which operates in response to detected values of various steering parameters and orientates the road wheels in a desired direction, and with a motor electric control unit according to the above description.

One exemplary embodiment of the present invention is described below with aid of the drawing.

FIG. 1 shows a schematic illustration of a motor electric control unit architecture according to the invention.

The computational and sensor part of the ECU 1 has three identical channels 2. Each channel 2 is composed of a torque sensor that measures the steering column torque and an RPS for sensing the rotor angle of the motor. Further each channel 2 receives the output of a current sensor of the actuator(s) 3. Each channel 2 in itself qualifies at least for ASIL-B. Based on all the inputs, a processor (also part of the channel) calculates the necessary pulse-width modulation (PWM) pattern to drive the actuator(s) 3, and emits the PWM signal. The actuator 3 is a power module, consisting of a FET predriver, a three phase FET bridge, and optionally a phase separation circuit. FIG. 1 shows one actuator 3 and two optional actuators 3, which can be required.

The channels 2 are synchronizing all sensor inputs periodically in order to a) detect if one channel 2 has a faulty input; the faulty input is masked by a majority voter 4 and thus neglected for further calculation, and b) to synchronize the state of the software; the same value is fed to all channels 2, e.g. the average of the sensor values. The channels' processors can have the same software, what does not protect against systematic faults, or for protection against systematic faults, they can have different software for each channel. The channels' inputs are fed to the voter(s) 4. Each actuator 3 has one assigned voter 4. Each voter 4 is a simple digital circuit that receives in addition to the sensor inputs, the three phase PWM signal from all channels, and makes a majority voting on them (with a settable tolerance time). This ensures that one faulty channel will not influence the behavior of the system. If a channel 2 is voted "out", the voter 4 gives feedback to all channels 2 via simple digital I/O. This way all channels 2 have a consistent picture about the health status of all others. The actuator's input is the voted PWM signal, and the actuator's output is the DC bus current signal for a power module. The power module is connected to three phases of a permanent magnet synchronous machine (PMSM). The machine has n*3 phases, where n is the number of actuator blocks in the system.

According to the invention fail-silent and/or fail-operational behavior can be achieved by combining several fail-arbitrary elements in a redundancy group. The sensors' outputs and actuators' inputs of all channels are used to vote on the correct inputs and outputs of the system. Microcontrollers (MCU) and System Basis Chips (SBC) can be fail-arbitrary with a minimum qualification level of ASIL-B. The number of channels is at least two and can be scaled depending on the required availability and safety. If only two channels are used, a faulty input of one leads to loss of functionality. In all cases each MCU has dedicated RPS and TSU sensor channels. The number of actuator paths is independent from the number of MCU channels, thus providing better scalability.

The invention claimed is:

1. A motor electric control unit for an electromechanical power steering mechanism or a steer-by-wire steering mechanism, which controls current through an electric assist motor in response to signals of steering mechanism sensors, the motor electric control unit comprising:
at least three channels, wherein each of the at least three channels has the steering mechanism sensors in redundancy; and
three voters, each voter being assigned to a separate actuator,
wherein the three voters are configured to vote on correct output of the steering mechanism sensors of the at least three channels, wherein the three voters are configured to drive each of the respective actuators with a same majority voted signal.

2. The motor electric control unit of claim 1 wherein the steering mechanism sensors include a steering column torque sensor and a rotor position sensor for sensing a rotor angle of the electric assist motor.

3. The motor electric control unit of claim 1 wherein each of the at least three channels include processors, wherein the processors have different software for each of the at least three channels to protect against systematic faults.

4. The motor electric control unit of claim 1 wherein the at least three channels each receive output of a current sensor of the actuators.

5. The motor electric control unit of claim 4 wherein the voters are configured to vote on the actuators' inputs of the at least three channels.

6. The motor electric control unit of claim 1 wherein the voters are majority voters with a settable tolerance time, which give feedback of health status of each of the at least three channels to all of the at least three channels.

7. The motor electric control unit of claim 1 wherein the voters are configured to mask a faulty channel of the at least three channels, which is in return neglected for further calculation, wherein the voters synchronizes a state of the motor electric control unit by feeding a same value to all of the at least three channels.

8. The motor electric control unit of claim 1 wherein each of the at least three channels qualifies at least for ASIL-B.

9. An electromechanical power steering mechanism for assisting steering of a motor vehicle, the electromechanical power steering mechanism comprising:
a torque sensor;
an electric motor for steering assist, wherein the electric motor is configured to apply an assistance torque in response to an output signal from the torque sensor that is indicative of an input torque applied by a driver of the motor vehicle to a steering wheel; and
a motor electric control unit comprising;
at least three channels, wherein each of the at least three channels has steering mechanism sensors in redundancy, and three voters, each voter being assigned a separate actuator, wherein the three voters are configured to vote on correct output of the steering mechanism sensors, wherein the three voters are configured to drive each of the respective actuators with a same majority voted signal.

10. A steer-by-wire steering system comprising:
a steering wheel;
a feedback actuator connected to the steering wheel for providing road feedback to a driver;
a plurality of road wheels;
a steering actuator with an electric motor that operates in response to detected values of various steering parameters and orients the road wheels in a desired direction; and
a motor electric control unit comprising:
at least two channels, wherein each of the at least two channels has steering mechanism sensors in redundancy, and voters, each voter being assigned a separate actuator, wherein the voters are configured to vote on correct output of the steering mechanism sensors, wherein the voters are configured to drive each of the respective separate actuators with a same majority voted signal.

* * * * *